US005798972A

United States Patent [19]
Lao et al.

[11] Patent Number: 5,798,972
[45] Date of Patent: Aug. 25, 1998

[54] HIGH-SPEED MAIN AMPLIFIER WITH REDUCED ACCESS AND OUTPUT DISABLE TIME PERIODS

[75] Inventors: Tim Lao; Dennis Blankenship, both of Durham; Rhonda Cassada, Hillsborough, all of N.C.

[73] Assignee: Mitsubishi Semiconductor America, Inc., Durham, N.C.

[21] Appl. No.: 767,135

[22] Filed: Dec. 19, 1996

[51] Int. Cl.$^6$ ................................................ G11C 7/00
[52] U.S. Cl. ...................... 365/189.11; 365/189.05; 365/205
[58] Field of Search ................ 365/189.11, 189.05, 365/205, 207, 208

[56] References Cited

U.S. PATENT DOCUMENTS

| | | | |
|---|---|---|---|
| 3,925,689 | 12/1975 | Rubenstein | 307/360 |
| 3,987,315 | 10/1976 | Matsue | 307/279 |
| 4,150,308 | 4/1979 | Adlhock | 307/264 |
| 4,618,785 | 10/1986 | van Tran | 307/530 |
| 4,663,701 | 5/1987 | Stotts | 363/60 |
| 4,703,199 | 10/1987 | Ely | 307/264 |
| 4,767,946 | 8/1988 | Taylor | 307/264 |
| 4,806,794 | 2/1989 | Walters, Jr. | 307/451 |
| 4,818,901 | 4/1989 | Young et al. | 307/451 |
| 4,982,111 | 1/1991 | Nakaizumi | 307/279 |
| 5,023,841 | 6/1991 | Akrout et al. | 365/207 |
| 5,113,097 | 5/1992 | Lee | 307/475 |
| 5,120,992 | 6/1992 | Miller et al. | 307/270 |
| 5,126,974 | 6/1992 | Sasaki et al. | 365/208 |
| 5,132,576 | 7/1992 | Park | 307/530 |
| 5,165,046 | 11/1992 | Hesson | 307/270 |
| 5,248,907 | 9/1993 | Lin et al. | 307/443 |
| 5,285,116 | 2/1994 | Thaik | 307/443 |
| 5,367,205 | 11/1994 | Powell | 326/27 |
| 5,369,318 | 11/1994 | Kuroda et al. | 326/66 |
| 5,387,828 | 2/1995 | Nakano | 326/68 |
| 5,440,182 | 8/1995 | Dobbelacre | 326/38 |
| 5,444,397 | 8/1995 | Wong et al. | 326/81 |
| 5,467,313 | 11/1995 | Jung et al. | 365/189.11 |
| 5,487,048 | 1/1996 | McClure | 365/207 |

*Primary Examiner*—Vu A. Le
*Attorney, Agent, or Firm*—McDermott, Will & Emery

[57] ABSTRACT

An output buffer is provided to output data read out from a memory array. The output buffer is composed of a main amplifier and an output driver. An input latch stage of the main amplifier is connected to an output of a preamplifier that reads out data from the memory array. A level shifter is coupled to the input latch stage to drive one of transistors in a transistor pair of the output driver. A driver stage is coupled to the input latch stage to drive another transistor in the output driver transistor pair. An output enable signal is supplied to the level shifter and to the driver stage to control the output driver. When the output enable signal is set to a first logic level, the output driver supplies valid data to an external device. When the output enable signal is at a second logic level, the output of the output driver is brought to a floating high-impedance state to disable data output.

16 Claims, 7 Drawing Sheets

Figure 1 (Background)

Figure 5B
NOR gate

Figure 4B
inverter

Figure 4A

Figure 3B
Clocked inverter

HIGH-SPEED MAIN AMPLIFIER WITH REDUCED ACCESS AND OUTPUT DISABLE TIME PERIODS

TECHNICAL FIELD

The present invention relates to memory devices, and more particularly, to a main amplifier arranged on a memory chip to read out data from a memory array.

BACKGROUND ART

Figure 1:
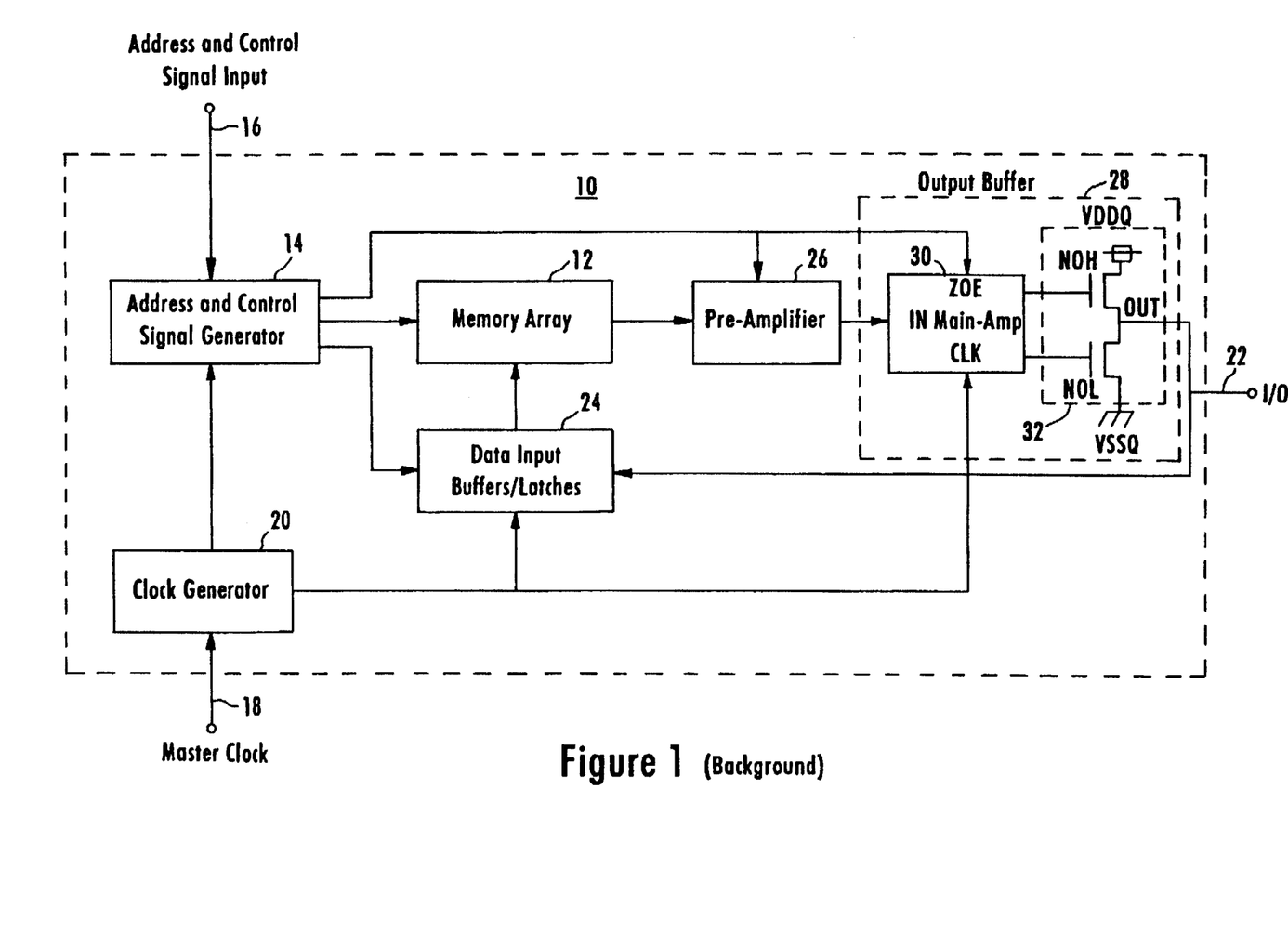
FIG. 1 is a simplified block diagram of a conventional memory chip.

Referring to FIG. 1, a conventional memory chip 10 contains a memory array 12 for storing data. An address and control signal generator 14 receives external address and control signals from address and control signal input 16 to provide control of data reading and writing from and to the memory array 12. A master clock input 18 supplies a clock generator 20 with an external master clock to control timing of data reading and writing operations. Input data are supplied to the memory array 12 from a data input/output 22 via data input buffers/latches 24. A preamplifier 26 and an output buffer 28 are employed in reading data stored in the memory array 12.

In the memory array 12, the output of a memory cell is connected to a memory cell sense amplifier. When a cell of the memory array is addressed for data access, the data stored in the addressed cell is amplified through the memory cell sense amplifier. The output of the memory cell sense amplifier is connected to the preamplifier 26 used to amplify the read data further. The output buffer 28 contains a main amplifier 30 having its input IN supplied with a data signal from the preamplifier 26. An output driver 32 is coupled to the main amplifier 30 to supply data read from the memory array to external logic devices via the input/output 22. The output driver 32 may comprise a pair of MOS transistors coupled in series between power sources VSSQ and VDDQ.

A data reading operation may be initiated for example by a raising edge of the external master clock. In response to the raising edge, the clock generator 20 controls the address and control signal generator 14 to produce an output enable signal ZOE supplied to the pre-amplifier 26 and to an input stage of the main amplifier 30 to provide data output from the memory input/output pin 22. The main amplifier is also supplied with a clock signal CLK produced by the clock generator 20.

The next raising edge of the external master clock may initiate a no operation cycle used to disable the memory output. Thereafter, a data writing operation via the input/output pin 22 may be performed.

Signal propagation through logic gates and parasitic resistance and capacitance, as well as logic decoding, cause delays between initiation of data reading or output disabling operations and instants, at which valid output data is supplied from the memory output, or the memory output is disabled. A delay time between the instant, at which a data reading operation is initiated, and the instant, at which output data is valid, is defined as the access time of a memory device in a read operation. A delay time between the instant, at which an output disabling operation is initiated, and the instant, at which a memory output is disabled, is defined as the output disable time of a memory device.

In high-frequency applications, for example, at a 200 MHz rate, a clock cycle is reduced to 5 ns. At such rates, it is critical to reduce the access time and the output disable time.

Therefore, it would be desirable to provide a main amplifier that allows the access time and the output disable time of an output buffer to be reduced.

DISCLOSURE OF THE INVENTION

Accordingly, one advantage of the present invention is in providing a main amplifier that allows the access time of an output buffer to be reduced.

Another advantage of the present invention is in providing a main amplifier that allows the output disable time of an output buffer to be reduced.

The above and other advantages of the invention are achieved, at least in part, by providing an output buffer that outputs data read from a memory array. The output buffer of the present invention comprises an input latch stage that produces a latched data signal in response to data read out from the memory array. A level shifter is responsive to the latched data signal for providing a first driving signal. A driving circuit provides a second driving signal in response to the latched data signal. An output driver is controlled by the first and second driving signals to produce an output signal. A control line is connected to the level shifter to provide an output control signal that enables the output driver to produce the output signal, or prevents the output driver from producing the output signal.

For example, output of the output driver may be brought into a high-impedance state to prevent the output signal from being produced, when the output control signal is in a first state. The output driver may be enabled to produce the output signal when the output control signal is in a second state.

In accordance with one aspect of the invention, the level shifter may comprise a first field-effect transistor and a second field-effect transistor connected in parallel. The latched data signal may be supplied to a gate of the first field-effect transistor, whereas the output control signal may be supplied to a gate of the second field-effect transistor.

The level shifter may further comprise an inverter and a third field-effect transistor. The output control signal is supplied via the inverter to a gate of the third field effect transistor.

Moreover, the level shifter may comprise fourth, fifth and sixth field effect transistors arranged together with the first field effect transistor in a cross-coupled latch configuration. The third field-effect transistor may be connected between the fifth and the sixth field effect transistor.

The driving circuit may comprise a gate circuit having a first input responsive to the output control signal and a second input responsive to the latched data signal.

In accordance with another aspect of the invention, a memory device comprises a memory array for storing data, a preamplifier coupled to the memory array for reading out the data, a main amplifier coupled to the preamplifier for amplifying a data signal produced by the preamplifier, an output driver coupled to the main amplifier for providing output of the data, and a control signal generator for producing an output enable signal to control the output of the data. The main amplifier includes a level shifter having a first input transistor for receiving the output enable signal from the control signal generator.

Still other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BEST MODE OF CARRYING OUT THE INVENTION

Although the invention has general applicability in the field of memory devices, the best mode for practicing the invention is based in part on the realization of a main amplifier in the memory device shown in FIG. 1.

Figure 2:
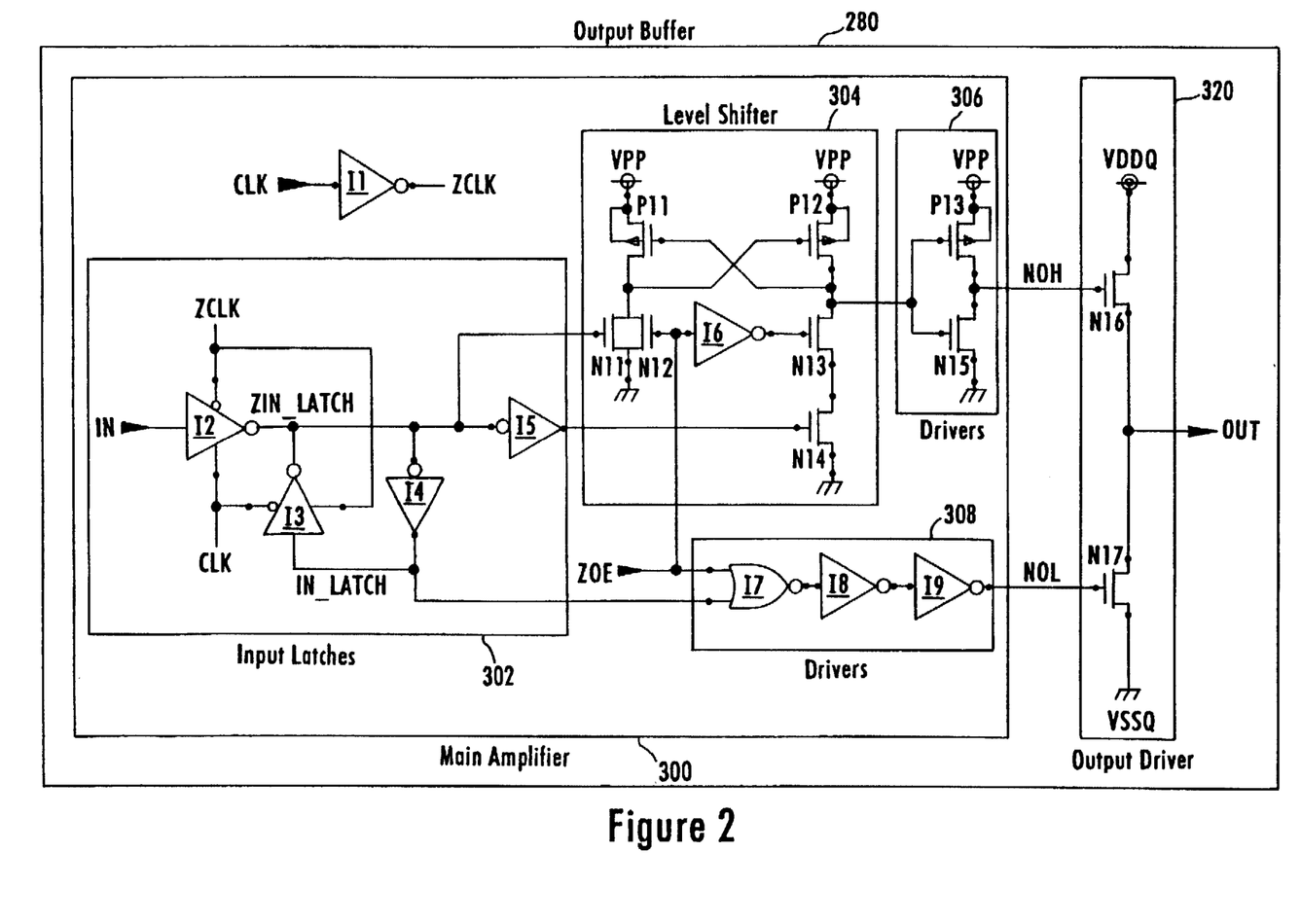
FIG. 2 is a diagram of an output buffer of the present invention.

Reference is now made to FIG. 2 showing a circuit diagram of an output buffer 280 of the present invention. The output buffer 280 arranged on a memory chip comprises a main amplifier 300 for amplifying data signals supplied from a preamplifier, such as the preamplifier 26, coupled to a memory array. An output driver 320 is coupled to the main amplifier 300 for providing data output.

The main amplifier 300 contains an input latch stage 302 for latching input data supplied from the preamplifier. A level shifter 304 is coupled to the input latch stage 302 to translate a small voltage range of the preamplifier into a larger voltage range required to support reliable operation of the output driver 320. Drivers 306 and 308 are arranged at outputs of the main amplifier 300 for driving transistors of the output driver 320.

The input latch stage 302 receives a data input signal IN from the preamplifier, and a clock signal CLK produced by a clock generator arranged on the memory chip. The clock signal CLK may be generated in response to an external master clock EXT K. An inverter I1 inverts the clock signal CLK to produce an inverted clock signal ZCLK.

The input latch stage 302 includes clocked inverters I2 and I3 having their outputs connected with each other, and inverters I4 and I5 having their inputs connected to the outputs of the inverters I2 and I3. Also, the input of the inverter I4 is coupled to the output of the clocked inverter I3. Thus, the inverters I3 and I4 are connected to form a latch.

The clock signals CLK and ZCLK control the clocked inverters I2 and I3 to allow data from the preamplifier to be supplied to the main amplifier 302. When the data input signal IN is fed to the input of the inverter I2, data is latched into the latch formed by the inverters I3 and I4. A latched inverted data input signal ZIN LATCH is produced at the output of the inverter I3. An IN LATCH signal, which is a latched inverted output of the ZIN LATCH signal, is produced at the output of the inverter I4.

Figure 3A:
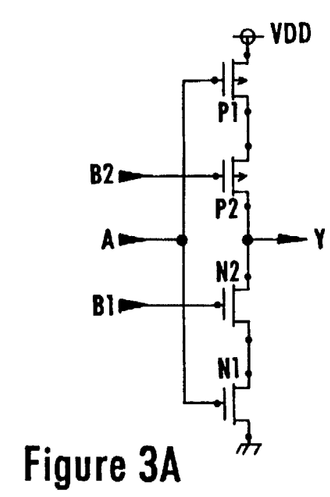
FIGS. 3A and 3B illustrate transistor implementation of clocked inverters in the output buffer.
Figure 3B:
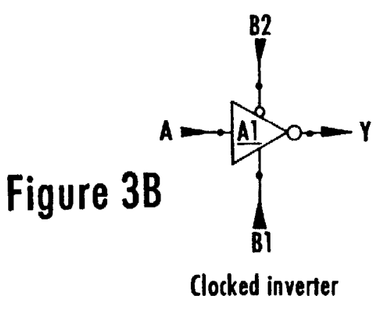
Figure 4A:
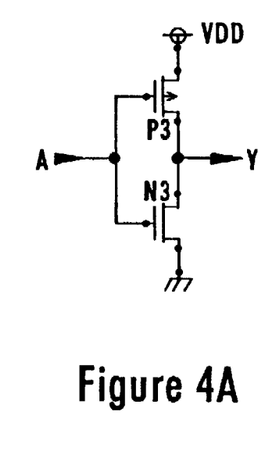
FIGS. 4A and 4B illustrate transistor implementation of inverters in the output buffer.
Figure 4B:
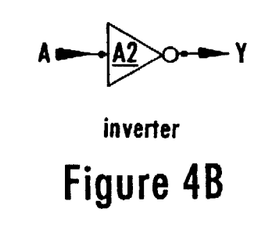

Examples of transistor representations of the clocked inverters I2 and I3, and inverters I1, I4 and I5 are shown in FIGS. 3 and 4, respectively. Referring to FIG. 3, each clocked inverter may comprise a pair of N-channel transistors N1 and N2, and a pair of P-channel transistors P1 and P2 connected between a voltage supply VDD, and a ground terminal. For example, VDD may be set at 3.3 V. Input signals are fed via an input A to gates of the transistors N1 and P1. Clock signals are supplied via inputs B1 and B2 to gates of transistors N2 and P2, respectively.

Thus, the data input signal IN is provided via the input A of the inverter I2. The inverted clock signal ZCLK is supplied to the input B2 of the inverter I2, and the input B1 of the inverter I3. The clock signal CLK is fed to the input B1 of the inverter I2, and the input B2 of the inverter I3.

As shown in FIG. 4, the inverters I1, I4, I5 and other non-clocked inverters described below may comprise an N-channel transistor N3 and a P-channel transistor P3 coupled between a voltage supply and a ground terminal. Input signals via an input A are supplied to gates of the transistors N3 and N5, whereas output signals are formed at a common node Y of the transistors.

The input latch stage 302 is coupled to the level shifter 304 that comprises P-channel transistors P11 and P12, and N-channel transistors N11 and N14 arranged in a cross-coupled latch configuration. Also, the level shifter 304 includes an N-channel transistor N12 arranged in parallel with the transistor N11. An N-channel transistor N13 is connected between the transistors P12 and N14. An inverter I6 is coupled between gates of the transistors N12 and N13. The inverter I6 may be implemented by the transistor arrangement shown in FIG. 4.

An inverted output enable signal ZOE supplied from a control generator, such as the address and control signal generator 14, is fed to the gate of the transistor N12, and via the inverter I6, to the gate of the transistor N13. A boosted voltage VPP typically set at 4.5–5.5 V may be supplied from an internal boosted-voltage generator to provide power supply of the level shifter 304.

The driver 306 coupled to a common node of the transistors P12 and N13 comprises a P-channel transistor P13 and an N-channel transistor N15 connected between the voltage source VPP and a ground terminal. The transistors P13 and N15 forming an inverter have a common node to define an output NOH of the main amplifier 300.

The driver stage 308 is coupled to the input latch stage 302 to provide an output NOL of the main amplifier 300. The driver stage 308 comprises a NOR gate I7 coupled to inverters I8 and I9.

Figure 5A:
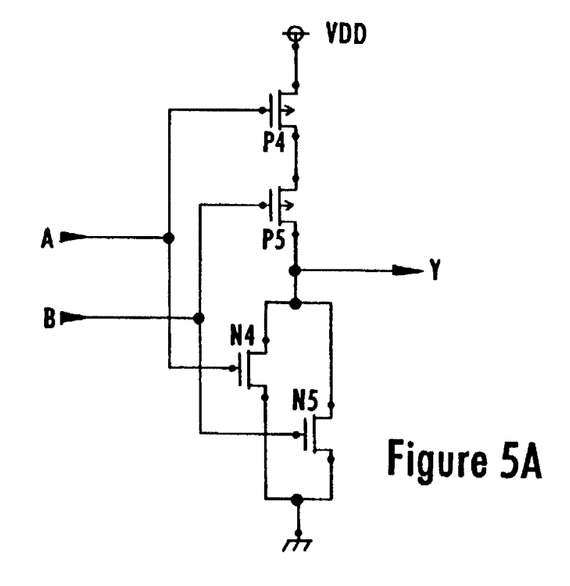
FIGS. 5A and 5B illustrate transistor implementation of a NOR gate in the output buffer.
Figure 5B:
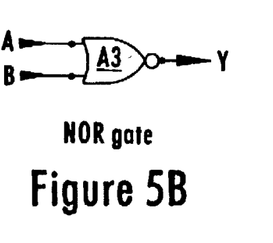

An example of transistor implementation of the NOR gate I7 is shown in FIG. 5. The NOR gate I7 may comprise N-channel transistors N4 and N5, and P-channel transistors P4 and P5, coupled between a VDD power source and a ground terminal. The VDD may be set at 3.3 V. The gates of the transistors P4 and N4 are connected with each other to define a first input A of the NOR gate I7. The gates of the transistors P5 and N5 are connected to provide a second input B of the NOR gate I7. A node Y is an output of the NOR gate I7. The inverters I8 and I9 may be implemented by the transistor circuit shown in FIG. 4.

The first input of the NOR gate I7 is supplied with the output enable signal ZOE, whereas the second input of the NOR gate I7 is connected to the output of the inverter I4 in the input latch stage 302. The inverters I8 and I9 are connected to the output of the NOR gate I7 to provide the output NOL of the main amplifier 300.

The outputs of the main amplifier 300 are coupled to the output driver 320 that contains N-channel transistors N16 and N17 connected in series between power sources VDDQ and VSSQ. The voltage VDDQ may be equal to 3.3 V, whereas the voltage VSSQ may be set at a ground potential. The gate of the transistor N16 is controlled by the output NOH of the main amplifier 300. The gate of transistor N17 is connected to the output NOL of the main amplifier 300. A common node of the transistors N16 and N17 defines an output OUT of the output buffer 280 connected to a data input/output pin of a memory chip.

Figure 6A:
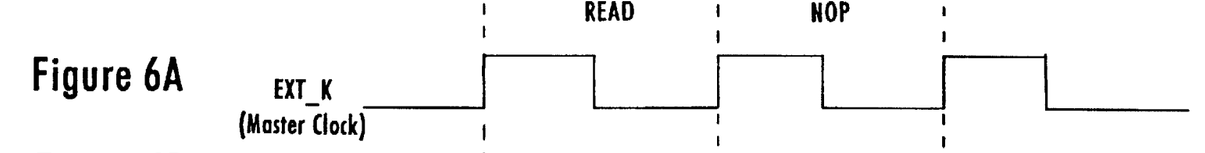
FIGS. 6A–6G are timing diagrams that illustrate various signals in the output buffer.
Figure 6B:
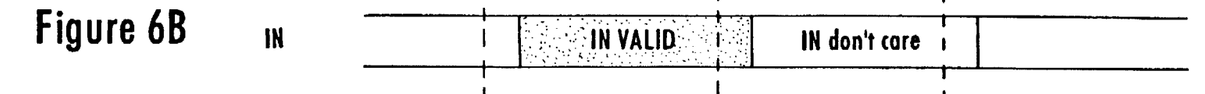
Figure 6C:
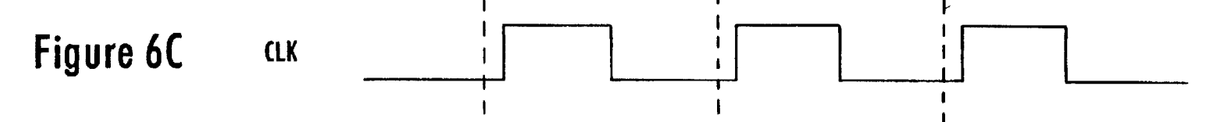

Referring to timing diagrams in FIGS. 6A–6G, the operation of the output buffer 280 is as follows. When the external master clock $EXT_{13}$ K supplied to the memory chip goes high (FIG. 6A), the clock signal CLK generated by the clock generator arranged on the chip goes high (FIG. 6C). To output data read from the memory array, the control signal generator arranged on the chip is responsive to the rising edge of the master clock to produce the output enable signal ZOE (FIG. 6D) at a low level (ZOE=L) prior to the CLK signal activation. For example, the high logic level may correspond to the VDD value equal to 3.3 V, and the low logic level may correspond to the ground potential level.

Figure 7:
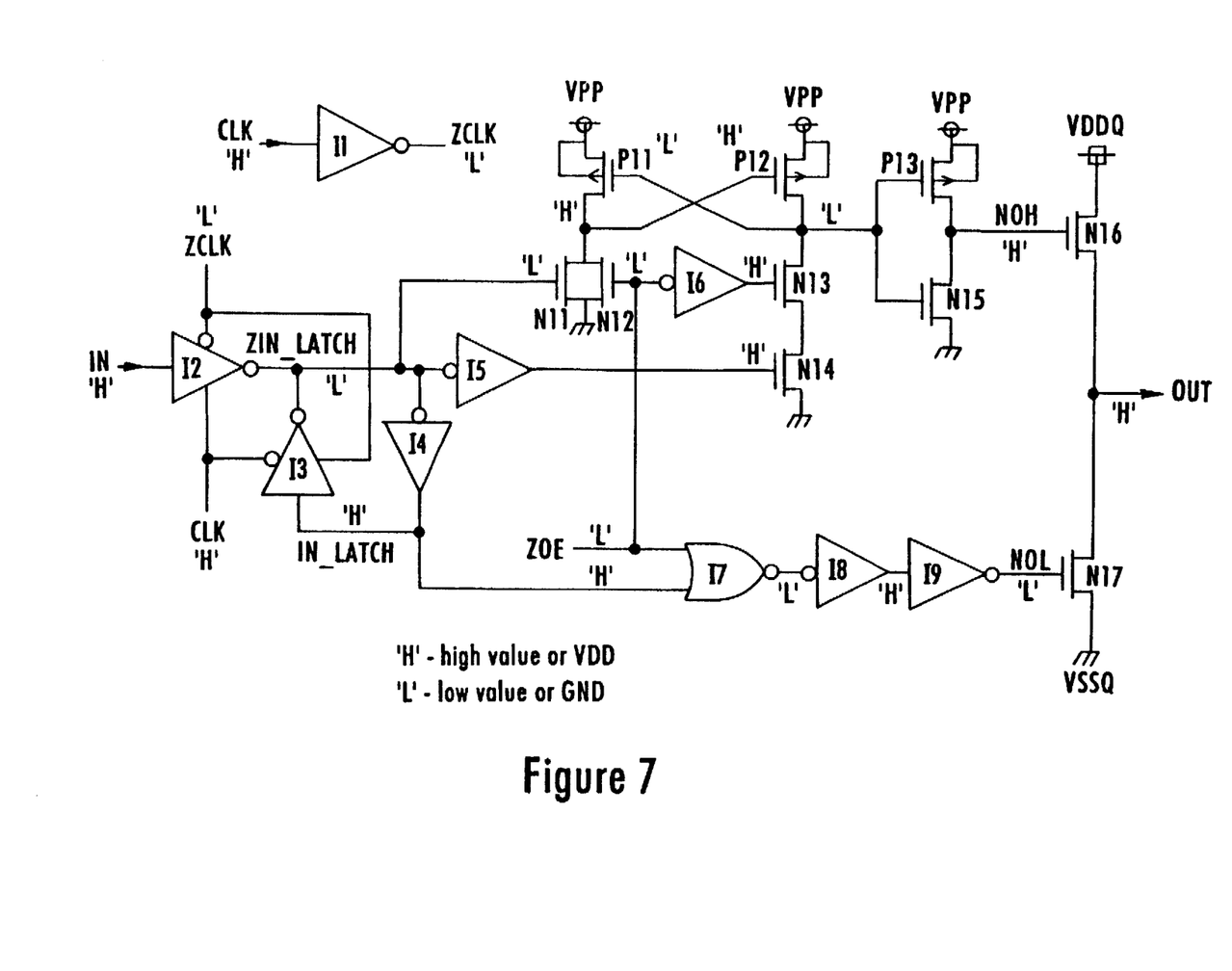
FIG. 7 is a diagram that illustrates a reading "1" mode of operations.

Reference is now made to FIG. 7, wherein the operation of the output buffer 280 is illustrated for a mode when bit "1" is read from the memory array. After the bit "1" is read from the memory array, the output of the pre-amplifier (FIG. 6B) connected to the inverter I2 is precharged to a high level H. Before the output signal IN of the preamplifier goes high, the low level of the ZOE signal turns the transistor N12 off and the transistor N13 on. As a result, a low level is produced at the node NOH.

Figure 6D:
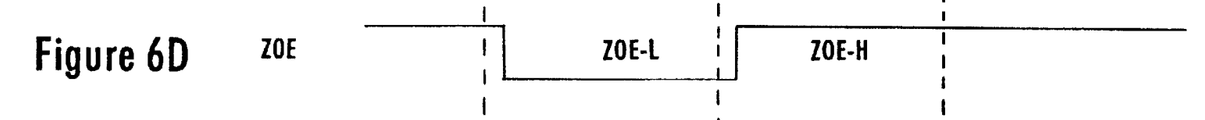
Figure 6E:
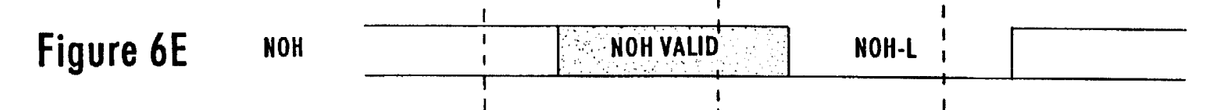

When the CLK signal (FIG. 6C) goes high (CLK=H), the inverted clock signal ZCLK becomes low (ZCLK=L). When the IN signal reaches a high level, the inverter I3 is controlled to produce the latched inverted data input ZIN LATCH at a low level (ZIN LATCH=L). When the ZIN LATCH signal goes low, a high level at the output of the inverter I5 turns the transistor N14 on to produce a low level at the output of the level shifter 304 defined by the drains of the transistors P12 and N13. The low level output of the level shifter 304 turns the transistor P13 on. As a result, the node NOH is boosted to the VPP level (FIG. 6E).

Figure 6F:
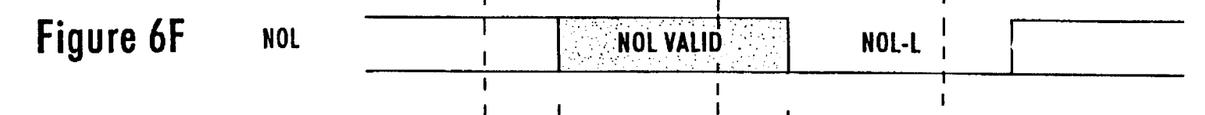
Figure 6G:
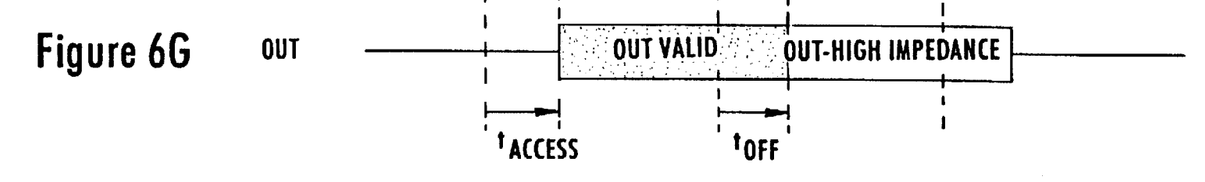

As the IN LATCH signal at the output of the inverter I4 goes high (IN LATCH=H), a high level is supplied to a second input of the NOR gate I7. A low level at the output of the NOR gate I7 is inverted by the inverters I8 and I9 to cause the transition of the potential at the node NOL to a low level (FIG. 6F). Thus, the potential at the OUT node is driven to a high level (FIG. 6G). As a result, the output OUT of the output buffer 280 is enabled to produce valid output data corresponding to bit "1" read from the memory array. As discussed above, the output node OUT is coupled to the input/output pin of the memory chip to supply the output data to an external device.

As shown in FIG. 6G, the instant, at which the node OUT is driven to a high level to enable the output of valid data, is delayed by a time interval $t_{ACCESS}$ with respect to the rising edge of the master clock EXT K (FIG. 6A). The time interval $t_{ACCESS}$ is the access time of the memory device for operations illustrated in FIG. 7. As the output enable signal ZOE can be supplied directly to the level shifter 304, the main amplifier arrangement of the present invention allows the access time to be substantially reduced compared to a conventional output buffer wherein an output enable signal is supplied to an input stage.

When the master clock EXT K goes low (FIG. 6A) causing the transition of the clock signal CLK to a low level (FIG. 6C), the ZIN LATCH and IN LATCH signals are latched by the inverters I3 and I4 to maintain the potential at the node OUT at a high level. Accordingly, the valid data output continues (FIG. 6G).

Figure 8:
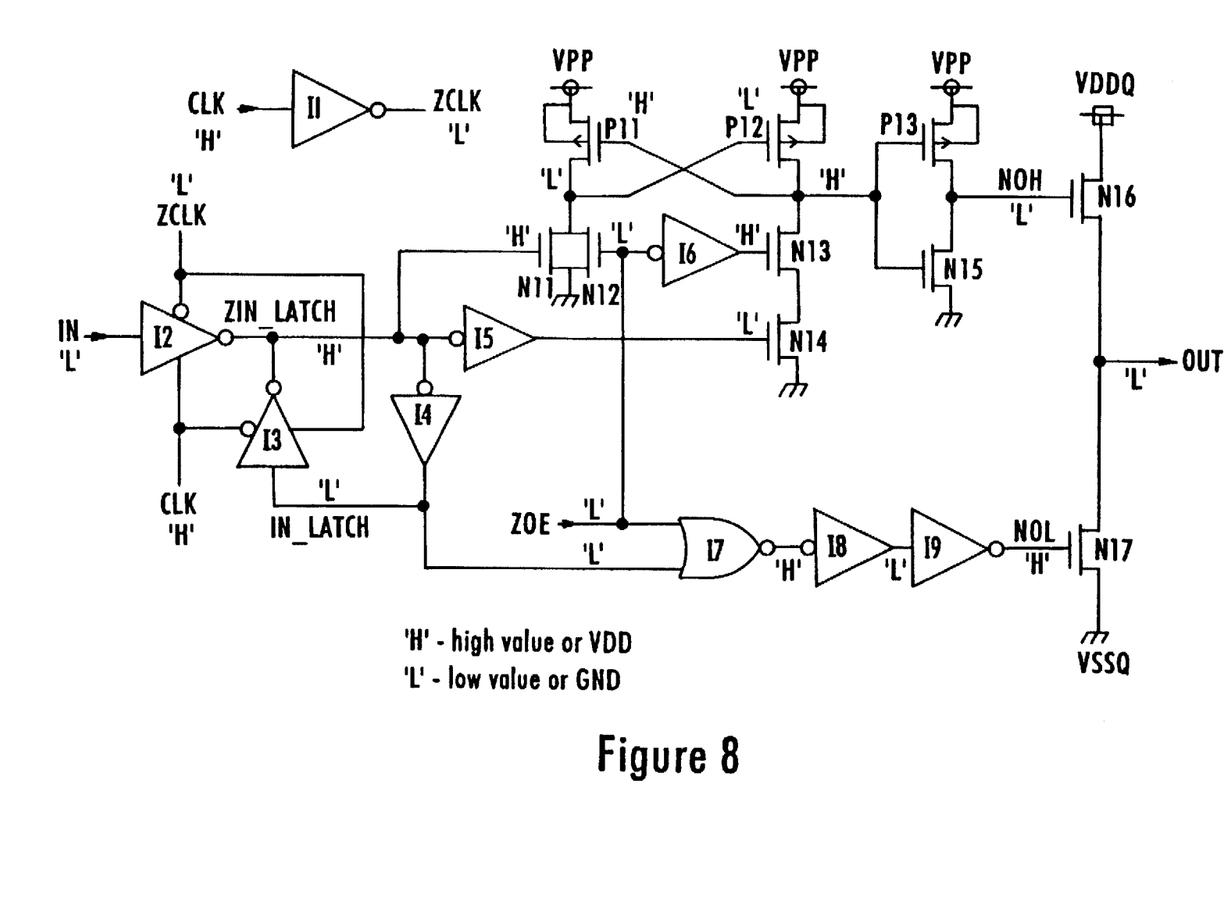
FIG. 8 is a diagram that illustrates a reading "0" mode of operations.

Reference is now made to FIG. 8, wherein the operation of the output buffer 280 is illustrated for the case when bit "0" is read from the memory array. After the bit "0" is read from the memory array, the data input signal IN supplied to the inverter I2 transitions to a low level L (FIG. 6B). The control signal generator produces the ZOE signal (FIG. 6D) at a low level (ZOE=L) in response to the raising edge of the master clock EXT K (FIG. 6A) to enable data output. The low level of the ZOE signal causes the transistor N12 to turn off and the transistor N13 to turn on. Also, the low level signal ZOE is supplied to the first input of the NOR gate I7.

When the CLK signal (FIG. 6C) goes high (CLK=H), the inverted clock signal ZCLK becomes low (ZCLK=L). Thereafter, when the IN signal transitions to a low level (FIG. 6B), the inverter I3 is controlled to produce the latched inverted data input ZIN LATCH at a high level (ZIN LATCH=H). When the ZIN LATCH signal goes high, a low level at the output of the inverter I5 turns off the transistor N14. A high level is produced at the output of the level shifter 304. As a result, the transistor N15 of the driver 306 turns on to maintain the node NOH at a low level (FIG. 6E).

Further, the IN LATCH signal produced at the output of the inverter I4 goes low to supply a low level at the second input of the NOR gate I7. A high level potential produced at the output of the NOR gate I7 drives the node NOL to a high level (FIG. 6F). As a result, the potential at the node OUT goes low (FIG. 6G). Accordingly, the data output via the node OUT is enabled to supply valid output data corresponding to bit "0" read from the memory array.

When the CLK signal goes low in response to the falling edge of the master clock EXT K, the ZIN LATCH and IN LATCH signals are latched by the inverters I3 and I4 to maintain a low level of the node OUT. Thus, the output of valid data continues (FIG. 6G).

As shown in FIG. 6G, the instant, at which the node OUT is driven to a low level to enable the output of valid data, is delayed by a time interval $t_{ACCESS}$ with respect to the rising edge of the master clock EXT K (FIG. 6A). The time interval $t_{ACCESS}$ is the access time of the memory device for operations illustrated in FIG. 8. As the main amplifier arrangement allows the output enable signal ZOE to be supplied directly to the level shifter 304, the present invention substantially reduces the access time compared to a conventional output buffer wherein an output enable signal is supplied to an input stage.

Figure 9:
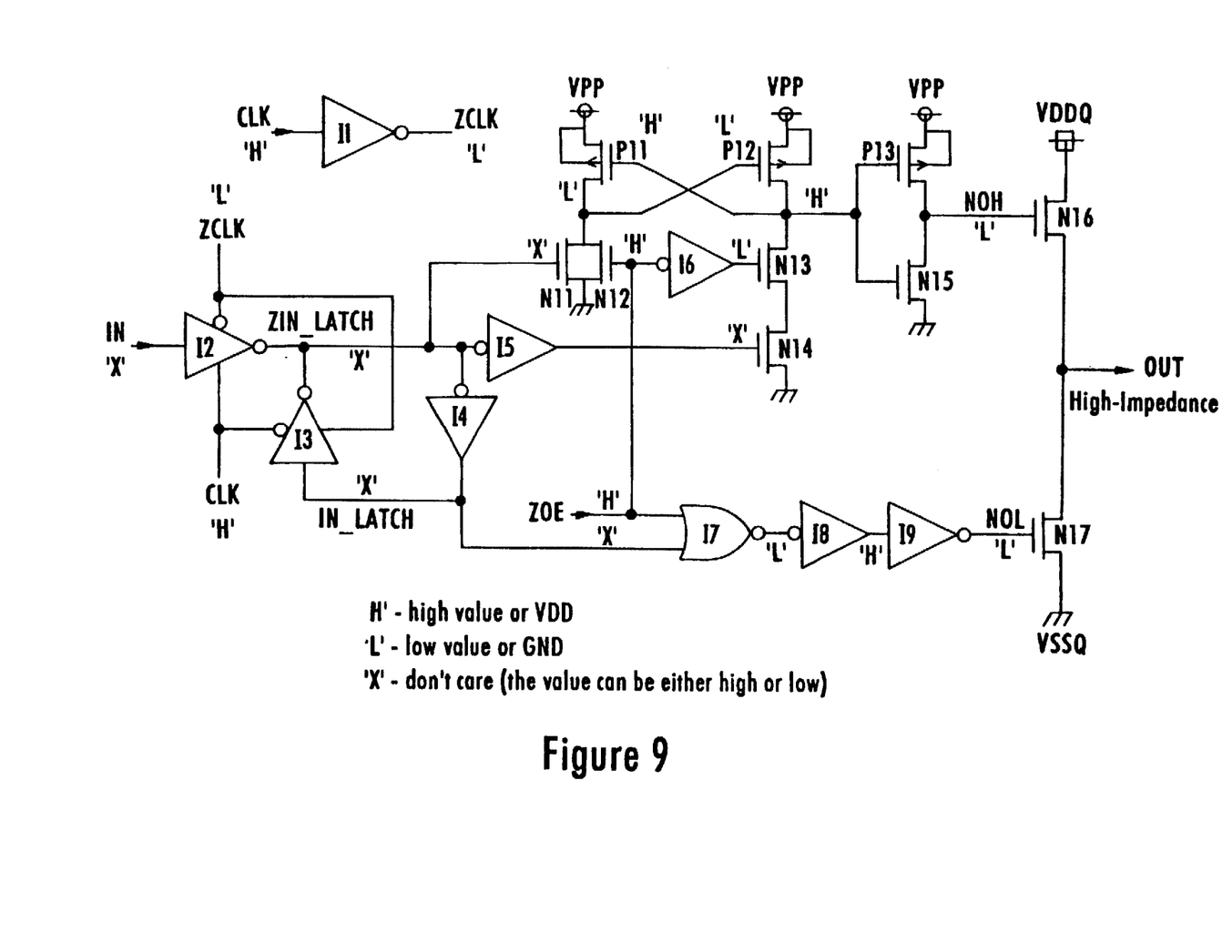
FIG. 9 is a diagram illustrating an output disabling mode of operations.

Reference is now made to FIG. 9 that illustrates an output disabling mode of the output buffer 280. In this mode performed after a reading bit "1" or "0" operation, the output enable signal ZOE is brought to a high level (ZOE=H) to disable data output from the memory chip. The output disabling mode is carried out in a no operation (NOP) cycle of the master clock in response to the raising edge of the master clock EXT K following a data reading operation (FIG. 6A).

In the output disabling mode, the data input IN (FIG. 6B) is in a don't care state because it does not matter whether the data supplied from the memory array is at a high or low level. Thus, the IN signal may be either at a high or low level. In response to the raising edge of the master clock EXT K, the ZOE signal goes high (FIGS. 6D). As a result, in the level shifter 304, the transistor N12 turns on, the transistor N13 turns off, and the transistor P12 turns on, regardless of the state of the IN signal. A high level produced at the output of the level shifter 304 defined by the drains of the transistors P12 and N13 overrides any input signal supplied from the preamplifier. The transistor N5 of the driver 306 turns on driving the node NOH to a low level. Also, the high level ZOE signal is supplied to the first input of the NOR gate I7.

At the same time, when the clock signal CLK goes high (FIG. 6C), any state of the IN signal can pass to the second input of the NOR gate I7. Regardless of the state of the second input, the output of the NOR gate I7 becomes low. As a result, the node NOL is driven to a low level.

As both of the nodes NOH and NOL are at a low level, the node OUT is in a floating high-impedance state. Thus, data output from the node OUT is disabled. The floating high-impedance state of the node OUT is maintained when the CLK signal goes low (FIG. 6C) because the NOH and NOL nodes remain at a low level.

As shown in FIG. 6G, the instant, at which the node OUT transitions into a high-impedance state, is delayed by a time interval $t_{OFF}$ with respect to the raising edge of the master clock EXT K when the output disabling mode is initiated. The time interval $t_{OFF}$ is the output disable time of the memory device. As main amplifier arrangement allows the output enable signal ZOE to be supplied directly to the level shifter 304, the present invention substantially reduces the output disable time compared to a conventional output buffer wherein an output enable signal is supplied to an input stage.

There accordingly has been described an output buffer that provides the output of data read out from a memory array. The output buffer is composed of a main amplifier and an output driver. An input latch stage of the main amplifier is connected to an output of a preamplifier that reads out data from the memory array. A level shifter is coupled to the input latch stage to drive one of transistors in a transistor pair of the output driver. A driver stage is coupled to the input latch stage to drive another transistor in the output driver transistor pair. An output enable signal is supplied to the level shifter and to the driver stage to control the output driver. In particular, when the output enable signal is set to a first logic level, the output driver supplies valid data to an external device. When the output enable signal is at a second logic level, the output of the output driver is brought to a floating high-impedance state to disable data output.

As the main amplifier arrangement allows the output enable signal to be supplied directly to circuitry immediately preceding the output driver, the access time and the output disable time of the output buffer are substantially reduced compared to conventional memory devices.

We claim:

1. Apparatus for providing an output signal in response to data read out from a memory, comprising:
   an input latch stage responsive to said data for producing a latched data signal,
   a level shifter responsive to said latched data signal for providing a first driving signal,
   a driving circuit responsive to said latched data signal for providing a second driving signal,
   an output driver controlled by said first and second driving signals for producing said output signal, and
   a control line connected to said level shifter for providing an output control signal to prevent said output driver from producing said output signal.

2. The apparatus of claim 1, wherein an output of said output driver is brought into a high-impedance state to prevent said output signal from being produced when said output control signal is in a first state.

3. The apparatus of claim 2, wherein said output produces said output signal when said output control signal is in a second state.

4. The apparatus of claim 3, wherein said level shifter comprises a first field-effect transistor and a second field-effect transistor connected in parallel.

5. The apparatus of claim 4, wherein said latched data signal is supplied to a gate of said first field-effect transistor, and said output control signal is supplied to a gate of said second field-effect transistor.

6. The apparatus of claim 5, wherein said level shifter further comprises an inverter and a third field-effect transistor.

7. The apparatus of claim 6, wherein said output control signal is supplied via said inverter to a gate of said third field effect transistor.

8. The apparatus of claim 7, wherein said level shifter further comprises fourth, fifth and sixth field effect transistors arranged together with said first field effect transistor in a cross-coupled latch configuration.

9. The apparatus of claim 8, wherein said third field-effect transistor is connected between said fifth and said sixth field effect transistor coupled between a voltage source and a ground terminal.

10. The apparatus of claim 9, wherein said driving circuit comprises a gate circuit having a first input responsive to said output control signal and a second input responsive to said latched data signal.

11. The apparatus of claim 10, wherein said output control signal is produced by a control signal generator arranged on a chip, together with said memory and said level shifter.

12. A memory device comprising:
    a memory array for storing data,
    a preamplifier coupled to said memory array for reading out said data,
    a main amplifier coupled to said preamplifier for amplifying a data signal produced by said preamplifier,
    an output driver coupled to said main amplifier for providing output of said data, and
    a control signal generator for producing an output enable signal to control the output of said data,
    wherein said main amplifier includes a level shifter having a first input transistor for receiving said output enable signal from said control signal generator,
    said level shifter produces a first driving signal to drive a first output transistor in said output driver, and
    said main amplifier further comprises a driver circuit for providing a second driving signal to drive a second output transistor in said output driver.

13. The memory device of claim 12, wherein said level shifter comprises a second input transistor responsive to said data signal and arranged in parallel with said first input transistor.

14. The memory device of claim 13, wherein said driver circuit comprises a gate circuit having a first input responsive to said output enable signal, and a second input responsive to said data signal.

15. The memory device of claim 14, wherein an output of said output driver is in a high-impedance state to prevent said data from being supplied from the memory device when said output enable signal is in a first state.

16. The memory device of claim 15, wherein the output of said output driver supplies the data to an external device when said output enable signal is in a second state.

* * * * *